United States Patent
Ihochi

[15] 3,644,798
[45] Feb. 22, 1972

[54] HIGH-POWER INTEGRATED CIRCUIT CERAMIC PACKAGE WITH METALLIC HEAT-CONDUCTING BODY

[72] Inventor: Takahiko Ihochi, Kodaira, Japan

[73] Assignee: Hitachi, Ltd., Tokyo, Japan

[22] Filed: June 5, 1970

[21] Appl. No.: 43,787

[30] Foreign Application Priority Data

June 16, 1969 Japan....................................44/55882

[52] U.S. Cl.....................317/234 R, 317/234 A, 317/234 E, 317/234 F, 317/234 G, 317/234 J, 317/234 M, 29/472.1, 29/588

[51] Int. Cl...........................................H01l 3/00, H01l 5/00

[58] Field of Search.......................317/234, 235, 1, 3.1, 4, 5, 317/5.4; 29/587, 588, 589, 472.1, 472.2, 472.3, 471.9, 472.5, 472.7, 472.9, 473.3

[56] References Cited

UNITED STATES PATENTS

| | | | |
|---|---|---|---|
| 3,265,805 | 8/1966 | Carlan et al. | 317/234 |
| 3,271,722 | 9/1966 | Garstang | 317/234 |
| 3,274,457 | 9/1966 | Wislocky | 317/234 |
| 3,281,922 | 11/1966 | Ferris | 317/234 |
| 3,325,704 | 6/1967 | Belasco et al. | 317/234 |
| 3,388,301 | 6/1968 | James | 317/234 |

FOREIGN PATENTS OR APPLICATIONS

| | | | |
|---|---|---|---|
| 1,543,300 | 9/1968 | France | 317/234 |

OTHER PUBLICATIONS

IBM Technical Disclosure Bulletin, Package Technique, by Suden et al., Vol. 9, No. 11, April 1967, pg. 1659 copy in Group 253 317/234(4)

*Primary Examiner*—John W. Huckert
*Assistant Examiner*—Andrew J. James
*Attorney*—Craig, Antonelli & Hill

[57] ABSTRACT

An enclosure for a semiconductor device provided with a ceramic case having an aperture in the bottom; a heat-radiating portion loosely inserted into the aperture and having a cylindrical protrusion; a metallic sleeve with a flat portion connected with the bottom of the ceramic case and a hollow cylindrical protrusion connected with the radiating portion, the thermal expansion coefficient of the metallic sleeve being substantially equal to that of the ceramic case; and a cover for forming a space for accommodating a semiconductor substrate and the ceramic case; whereby the thermal distortion generated between the radiating portion and the metallic sleeve can be absorbed by said hollow cylindrical protrusion.

10 Claims, 3 Drawing Figures

INVENTOR

TAKAHIKO IHOCHI

BY Craig, Antonelli, Stewart + Hill
ATTORNEYS

HIGH-POWER INTEGRATED CIRCUIT CERAMIC PACKAGE WITH METALLIC HEAT-CONDUCTING BODY

This invention relates to an improvement of an enclosure for a semiconductor device, and more particularly to an improvement of a ceramic package for an integrated circuit with high output power.

Although in a semiconductor integrated circuit device it has been common practice to dispose a semiconductor substrate in a ceramic package consisting mainly of alumina, the radiation of heat generated in the semiconductor substrate is not good due to the poor thermal conductivity of the ceramic itself. Therefore, according to a known package structure, in the case of a semiconductor integrated circuit used for a high output power, a portion in the ceramic package to which the semiconductor chip is fixed is perforated and a metal stud of, e.g., copper having a good thermal conductivity is inserted thereinto and fixed therein. However, in such a package, since a ceramic and a metal having thermal expansion coefficients different from each other are directly fixed together, there are defects such that thermal mismatching occurs therebetween and the ceramic having a weak structure is deformed by the thermal distortion, whereby a crack appears in the ceramic and peeling results in a portion between the ceramic and the metal. In an attempt to avoid such shortcomings, a metal layer of cobalt alloy, for example, is inserted between the ceramic and the metal as a buffer against such distortion, but the deformation and destruction of the ceramic package caused by such thermal mismatching can not be avoided completely.

One object of the present invention is to provide a ceramic enclosure possessing high thermal radiation characteristics and capable of avoiding the deformation and destruction of ceramic material caused by the thermal mismatching.

According to one embodiment of this invention, the ceramic material and the metal material for heat radiation are disposed with a space therebetween and they are united by means of a metal sleeve having a cylindrical protrusion.

Figure 1:
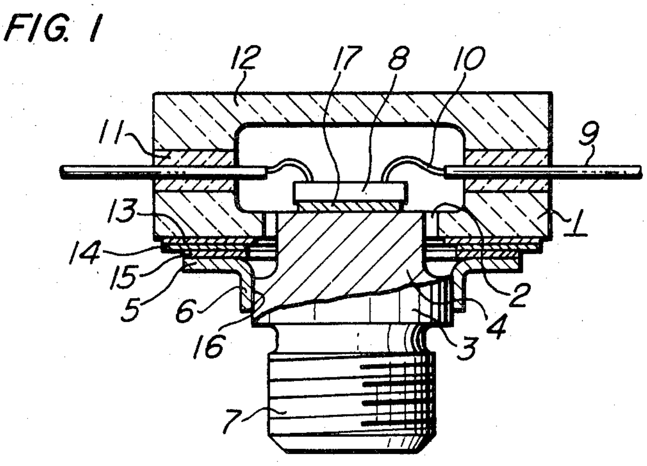
Figure 2:
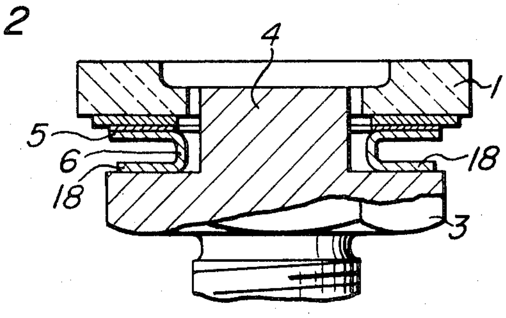
Figure 3:
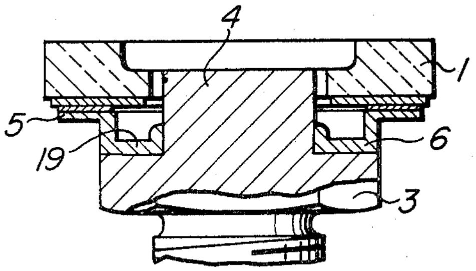

The above and other objects and features of the present invention will be made clear by the following detailed explanation with reference to the accompanying drawings, in which:

FIG. 1 is a whole longitudinal sectional view showing a principal structure of an enclosure according to one embodiment of this invention; and FIGS. 2 and 3 are longitudinal sectional views of main parts of enclosures showing other embodiments of this invention, respectively.

Explanation of one embodiment of this invention will be made with reference to FIG. 1. 1 is a ceramic case which is the main component of the enclosure, 2 is an aperture, e.g., a circular aperture, perforated in the center of the bottom of ceramic case, 3 is a heat-radiating portion inserted loosely into the circular aperture 2 and having a cylindrical protrusion 4, 5 is a metal sleeve closely in contact with the underside of the ceramic case 1 and the radiating portion 3 and having a hollow cylindrical protrusion 6 in order to seal tightly the space in which a semiconductor substrate is to be encapsuled, 7 is a screw portion provided under the radiating portion 3, 8 is a semiconductor substrate fixed on the top end surface of the cylindrical protrusion 4, 9 is an external lead, 10 is a connector wire of aluminum or gold connecting a semiconductor electrode to the external lead, 11 is a glass layer, and 12 is a cover of, e.g., ceramic tightly attached to the glass layer 11 in order to seal the upper opening of the ceramic case.

The ceramic case 1 and the ceramic cover 12 are made of ceramic material whose major ingredient is aluminum oxide, $Al_2O_3$. The radiating portion 3 is made of a high thermal-conducting material such as copper or an alloy consisting mainly of copper. The metal sleeve 5 is made of a metal, e.g., Koval (trade name; an alloy of Fe-Co-Ni), having the same or like thermal expansion coefficient as that of the ceramic case 1. The layer 13 is a metallized layer having molybdenum and manganese formed by well-known printing techniques on the bottom of the ceramic case 1. The layer 14 is a metal layer, for example, a plated metal layer of nickel or copper coated on the metallized layer 13 by, e.g., electroplating methods. The layer 15 is a silver solder layer adhering onto the plated layer. Thus, the metal sleeve 5 is connected to the bottom surface of the ceramic case 1 through these layers 13, 14 and 15. The nickel layer 14 is used to obtain a good adhesion of the solder layer 15, since it is difficult to solder the molybdenum-manganese layer 13 directly to the metal sleeve 5.

A portion of the cylindrical protrusion 6 of the metal sleeve 5 and the radiating portion 3 are joined through a solder layer 16 of, e.g., gold solder. The semiconductor substrate 8 is connected to the radiating portion 3 through a gold-silicon eutectic layer or a silver foil layer 17. The connection between the bottom of the ceramic case 1 and the metal sleeve 5 may be made directly, for example, by using glass having a low melting point.

In such a structure, the ceramic case 1 and the metal sleeve 5 are thermally matched, since they have the same or nearly equal thermal expansion coefficient. As for the metal sleeve 5 and the radiating portion 3, although they are thermally mismatched due to different thermal expansion coefficients, the thermal distortion is concentrated on the hollow cylindrical protrusion 6 of the metal sleeve 5. The cylindrical protrusion 4 of the radiator 3 and the ceramic case 1 have a circular space 2 therebetween to be able to move in the space so that no influence of thermal distortion is caused on the ceramic case 1, and hence there is no fear of cracking and peeling etc.

The metal sleeve 5 having a hollow cylindrical protrusion 6 which absorbs the thermal distortion between the ceramic case 1 and the radiation 3 can be formed in different forms from that in the embodiment as shown in FIG. 1. It can be joined with the radiator 3 in such a manner that the end 18 of the hollow cylindrical protrusion 6 is bent further outwardly as shown in FIG. 2, or that the end 19 is bent inwardly as shown in FIG. 3.

It is needless to say that the bottom of the radiator 3 can be formed in several types fixable to a printed board other than that as shown in the above embodiments with a screw 7 and a binding nut.

What is claimed is:

1. An enclosure for use in a semiconductor integrated circuit comprising:
   - a substrate of ceramic material having an aperture;
   - a heat-conducting body of metallic material having a protrusive portion which is inserted in the aperture of the substrate and spaced from the substrate;
   - a sleeve of metallic material having substantially the same coefficient of expansion as that of said substrate, said sleeve having in one end thereof a brim hermetically adhering to the bottom surface of the substrate, the heat-conducting body extending through the sleeve and hermetically adhering to the sleeve;
   - a semiconductor body connected to the top surface of the protrusive portion of the heat conducting body; and
   - a cover disposed on the substrate so as to form a room enclosing the semiconductor body between the cover and the substrate.

2. An enclosure according to claim 1, wherein said sleeve has in the other end another brim hermetically adhering to the heat conducting body.

3. An enclosure according to claim 2, wherein said heat-conducting body has a brim the surface of which extends substantially in parallel to the bottom surface of the substrate, wherein the brim of said sleeve on the other end thereof hermetically adheres to the surface of the brim of said heat-conducting body.

4. An enclosure according to claim 1, wherein the substrate consists principally of aluminum oxide, while the sleeve consists essentially of an alloy of iron, cobalt and nickel.

5. An enclosure according to claim 4, wherein the sleeve hermetically adheres the substrate through a triple layer of a metallized layer of molybdenum and manganese formed on the bottom layer of the substrate, an intermediate layer selected from the group consisting of nickel and copper formed on the metallized layer, and a solder layer interposed between the intermediate layer and the brim of the sleeve.

6. An enclosure for use in a semiconductor integrated circuit comprising:

a substrate of ceramic material having an aperture therein;

a heat-conducting body made of metallic material, the thermal expansion coefficient of which is different from that of said ceramic substrate, having a protruding portion which is inserted in the aperture of the substrate and spaced from said substrate;

a sleeve made of metallic material having substantially the same coefficient of expansion as that of said substrate, said sleeve having on one end thereof a brim hermetically adhering to the bottom surface of the substrate, the heat-conducting body extending through said sleeve and hermetically adhering to said sleeve;

a semiconductor body connected to the top surface of the protruding portion of said heat-conducting body; and a cover disposed on said substrate, so as to form a room enclosing the semiconductor body between the cover and the substrate.

7. An enclosure according to claim 6, wherein said heat-conducting body has a brim, the surface of which extends substantially parallel to the bottom surface of the substrate, and wherein said sleeve has, on one end thereof, a brim hermetically adhering to the heat-conducting body, and on the other end thereof, a brim hermetically adhering to the surface of the brim on said heat-conducting body.

8. An enclosure according to claim 7, wherein said sleeve has an L-shaped cross section.

9. An enclosure according to claim 7, wherein said sleeve has a U-shaped cross section.

10. An enclosure according to claim 7, wherein said sleeve has one end thereof bent inwardly so as to contact said protrusion and another end thereof bent outwardly so as to lie flush against said substrate.

* * * * *